United States Patent
Harb et al.

(10) Patent No.: US 7,800,735 B2
(45) Date of Patent: Sep. 21, 2010

(54) Z-STAGE WITH DYNAMICALLY DRIVEN STAGE MIRROR AND CHUCK ASSEMBLY

(75) Inventors: Salam Harb, Los Gatos, CA (US); Kent Douglas, San Martin, CA (US); Marek Zwyno, San Jose, CA (US); James Haslim, Dublin, CA (US); Jon Hamilton, Alameda, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 110 days.

(21) Appl. No.: 11/420,985

(22) Filed: May 30, 2006

(65) Prior Publication Data

US 2007/0247778 A1    Oct. 25, 2007

Related U.S. Application Data

(60) Provisional application No. 60/745,384, filed on Apr. 21, 2006.

(51) Int. Cl.
*G03B 27/58* (2006.01)
(52) U.S. Cl. .................................................. 355/72
(58) Field of Classification Search ........... 355/72, 355/53, 75
See application file for complete search history.

(56) References Cited

U.S. PATENT DOCUMENTS

2004/0165166 A1* 8/2004 Kamiya .................. 355/53
2005/0128460 A1* 6/2005 Van Den Biggelaar et al. ... 355/72
2005/0269524 A1* 12/2005 Hastings et al. .......... 250/491.1
2007/0013893 A1* 1/2007 Loopstra ..................... 355/72

OTHER PUBLICATIONS

Vertical—Definition from the Merriam-Webster Online Dictionary, http://www.meriam-webster.com/dictionary/vertical, downloaded on May 28, 2009, 2 pages.
U.S. Appl. No. 12/849,718 entitled "Z-Stage With Dynamically Driven Stage Mirror and Chuck Assembly" filed Aug. 3, 2010.

\* cited by examiner

*Primary Examiner*—Peter B Kim
*Assistant Examiner*—Chia-how Michael Liu
(74) *Attorney, Agent, or Firm*—Joshua D. Isenberg; JDI Patent

(57) ABSTRACT

Substrate support apparatus and methods are described. Motion of a substrate chuck relative to a stage mirror may be dynamically compensated by sensing a displacement of the substrate chuck relative to the stage mirror and coupling a signal proportional to the displacement in one or more feedback loops with Z stage actuators and/or XY stage actuators coupled to the stage mirror. Alternatively, a substrate support apparatus may include a Z stage plate a stage mirror, one or more actuators attached to the Z stage plate, and a substrate chuck mounted to the stage mirror with constraints on six degrees of freedom of movement of the substrate chuck. The actuators impart movement to the Z stage in a Z direction as the Z stage plate is scanned in a plane perpendicular to the Z direction. The actuators may include force flexures having a base portion attached to the Z stage plate and a cantilever portion extending in a lateral direction from the base portion. The cantilever portion may include a parallelogram flexure coupled between the base portion and a free end of the cantilever portion.

8 Claims, 4 Drawing Sheets

Z-STAGE WITH DYNAMICALLY DRIVEN STAGE MIRROR AND CHUCK ASSEMBLY

CROSS-REFERENCE TO A RELATED APPLICATION

This application claims priority from co-pending provisional patent application Ser. No. 60/745,384, which was filed on Apr. 21, 2006, the entire disclosures of which are incorporated herein by reference.

FIELD OF THE INVENTION

This invention generally relates to substrate processing and more particularly to substrate supports for substrate processing.

BACKGROUND OF THE INVENTION

Modern semiconductor systems often depend on accurate measurement of the position of a semiconductor substrate. An example of a tool commonly used in semiconductor wafer metrology and inspection is an electron microscope. FIG. 1 depicts an electron beam microscope system 100 of the prior art. An electron optical column 102 focuses an electron beam 101 onto a surface of a wafer 104. Electrons scattered from the wafer 104 are collected to form an image. To facilitate location of defects on different parts of the wafer 104, the wafer is typically processed on a support 105 having a chuck 106 and XY stage 108 for translation of the chuck (and wafer) in X and Y directions more or less parallel to the plane of the wafer 104. Since the electron beam microscope 100 must operate in a vacuum chamber 103, the chuck 106 is typically a high voltage electrostatic chuck. The change in position of the wafer 104 can be measured using an interferometer system 112 measuring off a stage mirror 110. The stage mirror 110 includes highly polished faces 114 oriented perpendicular to the X and/or Y axes. In the interferometer 112 a beam of light 116 (e.g., from a laser) is split by a beamsplitter 118. Part of the light (referred to sometimes as the reference beam) reflects off a fixed mirror 120 back to the beamsplitter 118. Another part of the light (referred to sometimes as the measured beam) reflects off the highly polished face 114 back to the beamsplitter 118. The beamsplitter 118 combines both parts and the combined optical signal strikes a photodetector 119. An interference signal from the photodetector 119 changes in a predictable way as a result of movement of the stage mirror 110.

As the wafer 104 moves in the X and Y the depth of focus of the electron beam 101 may vary as a result of topographical features or tilting of the surface of the wafer 104. To adjust for variations in topography of the wafer surface the support 105 may include a Z stage 122. The Z stage 122 includes a stage plate 124, one or more piezoelectric actuators 126. The wafer chuck 106 is attached to the Z stage plate 124 by compliant mounts 128. High voltage electrical isolators 130 provide electrical insulation between the chuck 106 and the Z stage plate 124. The stage mirror 110 is mounted to the Z stage plate 124 through kinematic mounts 132, e.g., of the sphere and V-groove type, the sphere and cone type and/or the sphere and flat type. In many prior art systems, the wafer surface is analyzed to determine a slope and then the Z stage 122 is moved up or down to level the wafer statically. Such systems can not dynamically adjust the height of the wafer 104 in response to changing wafer topography.

Furthermore, the Z stage 122 carrying the wafer chuck 106 is mechanically separated from the stage mirror 110, which typically is rigidly coupled to the XY stage 108. As a result of this mounting there is a long mechanical path indicated by the dashed line 134 (sometimes referred to as a metrology loop) between the polished surface 114 on the stage mirror 110 and the wafer chuck 106. Due to this long path static and dynamic XY position errors due to relative motion between the wafer chuck 106 and the stage mirror 110 are properly not tracked by the electron beam 101. Instead, these errors are tracked by image computer alignment at a relatively slow bandwidth. These errors include scan to scan errors, intra-scan errors and high frequency (kernel to kernel) errors. In systems such as that shown in FIG. 1, a position sensor 136, e.g., a capacitor gauge, placed proximate the wafer chuck 106 may be used to characterize these errors by measuring a relative displacement $\Delta X$ between the chuck 106 and the stage mirror 110.

In alternative prior art designs, e.g., the Mebes Exara, designed by Etec systems, a substrate (e.g., a mask) may be coupled to the stage mirror 110, but is pre-aligned prior to scanning the mask in the X and Y directions and is not dynamically adjusted in the Z direction during the scan. In this design, static pre-alignment of the substrate is mapped prior to the scan and is not dynamically adjusted into the optical focal plane during the scan. Thus, changes in height have to be compensated by some other means.

Prior art attempts to address tracking errors due to relative motion between the substrate chuck 106 and the stage mirror 110 have been limited by the bandwidth of the deflection system, interferometer data rate and data age. These errors may be large enough to case either a false defect detection or loss of inspection sensitivity.

Thus, there is a need in the art, for a substrate support system that overcomes these disadvantages.

SUMMARY OF THE INVENTION

The disadvantages associated with the prior art are overcome by embodiments of the present invention directed to substrate support apparatus and methods.

According to an embodiment of the invention, motion of a substrate chuck relative to a stage mirror may be dynamically compensated by sensing a displacement of the substrate chuck relative to the stage mirror and coupling a signal proportional to the displacement in one or more feedback loops with means for dynamically compensating for motion of the substrate chuck relative to the stage mirror. The means for dynamically compensating may include Z stage actuators and/or XY to the stage mirror and/or XY energetic-beam deflection mechanisms.

According to an alternative embodiment of the invention a substrate support apparatus may include a Z stage plate, a stage mirror, one or more actuators attached to the Z stage plate, and a substrate mounted to the stage mirror with constraints on six degrees of freedom of movement of the substrate chuck. The actuators are configured to impart movement to the Z stage in a Z direction as the Z stage plate is scanned in one or more directions in a plane perpendicular to the Z direction. The actuators may include force flexures. Each force flexure may include a base portion attached to the Z stage plate and a cantilever portion extending in a lateral direction from the base portion. The cantilever portion may include a parallelogram flexure coupled between the base portion and a free end of the cantilever portion.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1:
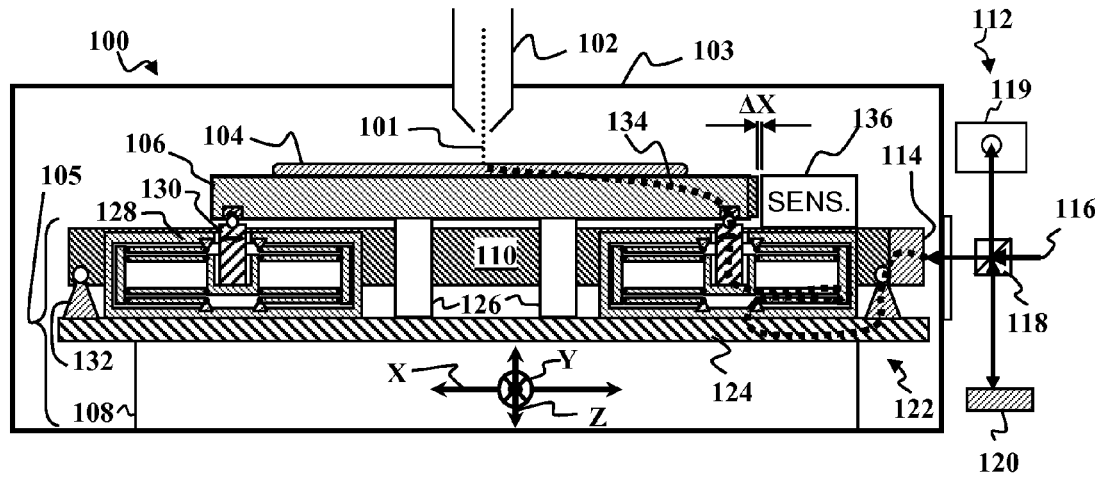
FIG. 1 is a schematic side-cross section of a substrate support system used in conjunction with an electron microscope of the prior art.
Figure 2:
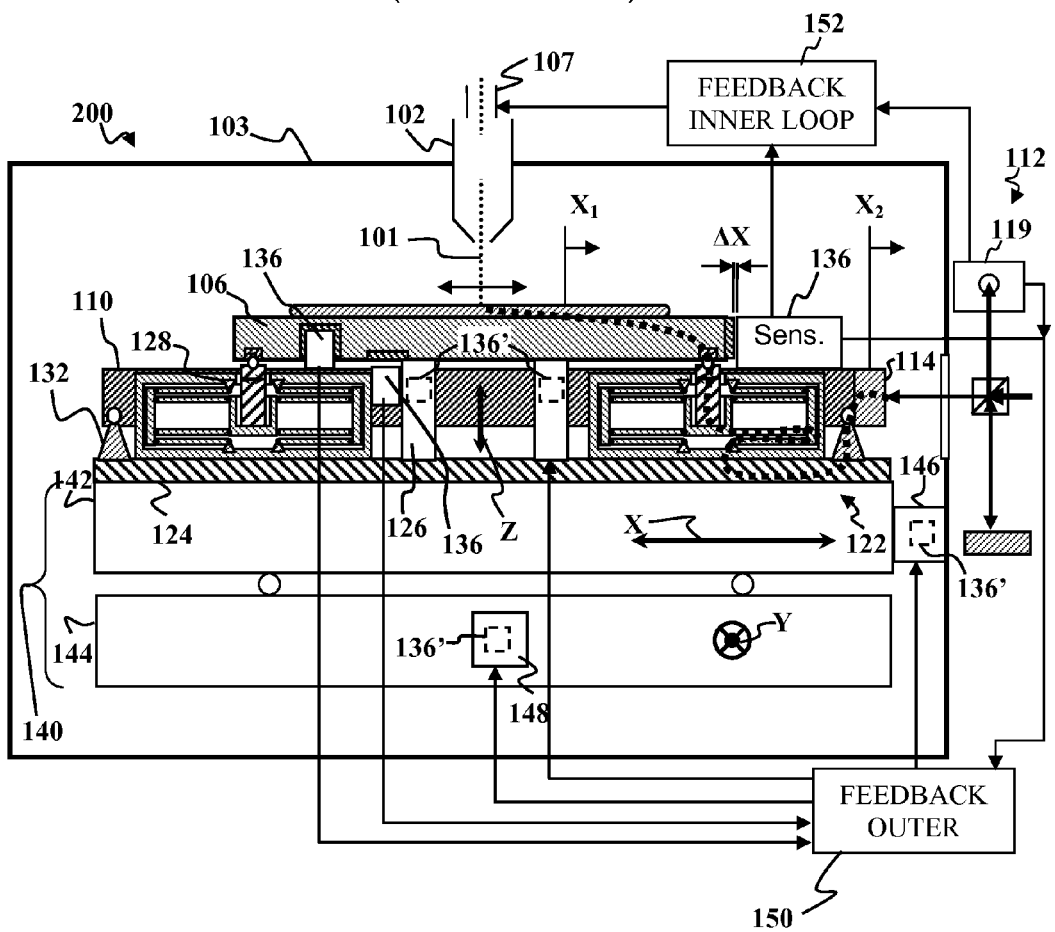
FIG. 2 is a schematic diagram is a schematic side-cross section of a substrate support system according to an embodiment of the present invention.

According to a first embodiment of the present invention, a conventional substrate support system of the type shown in FIG. 1 may be modified by coupling a feedback signal from a chuck position sensor to a closed loop drive that moves an energetic beam (e.g., the electron beam 101) in XY and/or actuators of the Z stage to compensate for motion of chuck 106 relative to stage mirror 110. As shown in FIG. 2, a substrate support system 200 may include many of the features described above with respect to FIG. 1. Features common with the support system 100 of FIG. 1 are identified by the same numbers shown in FIG. 1 FIG. 2. The substrate support system 200 includes a Z-stage 122 having a Z-stage plate 124, and Z-actuators 126. A substrate support chuck 106, e.g., an electrostatic chuck, is compliantly connected to a Z stage plate 124, e.g., by flexures 128. Preferably, the flexures 128 are characterized by high stiffness with respect to motion in the X-Y plane and rotation about Z-axis constraints while allowing the chuck 106 to move along the Z-axis.

The Z stage 122 is mounted to an XY stage 140, having an X-stage 142 and a Y-stage 144. Preferably, the coupling between the Z-stage 122 and the X-Y stage 140 is characterized by high stiffness with respect to motion in the X-Y plane and rotation about Z-axis constraints while allowing the Z-stage to move along the Z-axis. The X stage 142 includes an X actuator 146 that provides an actuation force in an X-direction. The Y stage 144 includes a Y actuator 148 that provides an actuation force in a Y-direction that is, e.g., perpendicular to the X-direction. A stage mirror 110 is kinematically mounted to the Z stage plate 124, e.g., with three ball and groove type mounts 132. The stage mirror 110 may include polished surfaces 114 that can be used as reflecting surfaces for an interferometer 112. Z actuators 126 (e.g., piezoelectric actuators) provide actuating forces that move the chuck 106 relative to the Z stage plate along a Z-direction that is normal (i.e., perpendicular) to the X- and Y-directions. The substrate chuck 106, stage mirror 110, and Z stage 122 may be disposed within a vacuum chamber 103.

One or more relative position sensors 136 are configured to sense a displacement of the substrate chuck 106 relative to the stage mirror 110 with respect to the X- and/or Y- and/or Z-directions. By way of example the chuck 106 may move in the X-direction by an amount $X_1$ while the stage mirror 110, moves by a different amount $X_2$. One sensor 136 may sense the relative displacement $\Delta X = X_1 - X_2$. Other sensors 136 may similarly sense relative displacement in the Y and Z directions. The sensors 136 may be any suitable motion sensor, e.g., a capacitive, inductive or optical sensor. By way of example, the position sensors 136 may be capacitance sensors mounted to the stage mirror 110 proximate the substrate chuck 106. The capacitance sensors may produce a signal that depends in a determinable way on a relative displacement between the chuck 106 and the stage mirror 110. It is noted that the interferometer 112 may be regarded as a form of optical relative position sensor. The relative position sensors 136 and/or photo detector 119 of the interferometer 112 may be coupled in one or more outer feedback loops 150 to one or more of the actuators 126, 146, and 148 so that the actuators can dynamically compensate for motion of the substrate chuck 106 relative to the stage mirror 110. In certain embodiments of the invention it is desirable to have one sensor proximate the metrology loop 134 described above with respect to FIG. 1 and one or more sensors co-located with the actuators. One or more additional relative position sensors 136' may be built into the Z-actuators 126 and/or XY stage actuators 146, 148.

For fine position correction of the electron beam 101 an XY beam deflection mechanism 107 (e.g., electrostatic beam deflector plates or beam-deflecting electromagnets) in the electron optical column 102) is coupled via an inner feedback loop 152 to the photo detector 119 of the interferometer 112 and/or the position sensors 136. The inner feedback loop 152 allows for fine XY correction of the position of the electron beam 101 on the wafer 104. Those of skill in the art will recognize that the same concept may apply to beam position correction for other energetic beams, such as ion beams (e.g., using electrostatic or electromagnetic beam deflection), laser beams (e.g., using beam steering mirrors as the correction mechanism 107) and the like.

In some applications, e.g., where the system 200 is used for substrate support in an electron beam the stage control loop (e.g., outer feedback loop 150 and actuators 146, 148 may be burdened with a large following error, e.g., between about 100 nm and about 2 microns. If the system needs images aligned to about 1/10 of a pixel, two more control mechanisms may be employed: beam deflection following a stage mirror position signal from the interferometer 112 and/or additional chuck position sensor 136, and an image computer (not shown), performing dynamic alignment of images, to the extent the other mechanisms leave any residuals. The computer may be able to correct position errors in a range from about 250 nanometers (nm) down to about 2.5 nm. The position signal from the interferometer 112 may be fed back to the stage control actuators 146, 148, which can make position adjustments on the order of a few hundred millimeters down to about 2 microns. The stage control actuators may leave a residual of a few microns. If the stage feedback loop is relatively slow (e.g., tens of Hz) the outer feedback loop 150 and stage actuators 146, 148 may not be fast to correct image jitter on the order of 250 nm to 2 microns coming from roller vibration and other sources. The gap may be filled by e-beam correction, which has a much higher speed, e.g., about 10 kHz, and accuracy of single nanometers or better. Presently available interferometers may be accurate to about 0.1 nm, but mechanical and electrical noise may bring this up to about 2 nm.

In other embodiments of the present invention, the metrology loop may be shortened and the relative displacement between the substrate chuck 106 and the stage mirror 110 may be substantially reduced by directly mounting the chuck to the stage mirror. This has not been done in a system that can scan in the Z-direction. This has largely been due to the relatively large mass of the substrate chuck. A Z-stage with sufficiently strong actuators and sufficiently stiff flexures had not previously been developed. Generally, it is desirable to use piezoelectric actuators for substrate supports in electron beam systems. Voice coil actuators typically are not used since they produce magnetic fields that can interfere with the electron beam. Voice coil actuators can be used if they are sufficiently magnetically shielded and/or positioned far away from the electron beam. Direct Z-actuation by a piezo stack would require a relatively long piezo actuator and a relatively long compliant flexure to produce the desired Z-displacement. As a result, the stage mirror and chuck would tend to wobble in the X-Y plane.

Figures 3A, 4A, 4B:
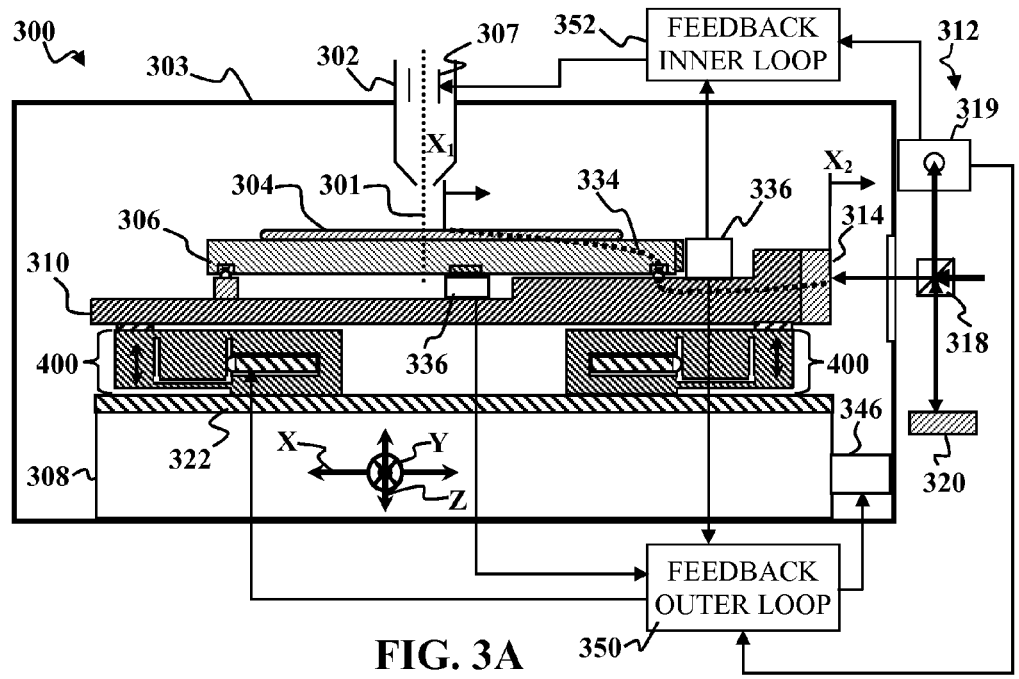
FIGS. 3A-3B are cross-sectional schematic diagrams of substrate support systems according to alternative embodiments of the invention.
FIG. 4A is a three-dimensional view of a force flexure that may be used with the substrate support system of FIG. 3A.
FIG. 4B is a cross-sectional view of the force flexure of FIG. 4A taken along line B-B'

FIG. 3A depicts a substrate support apparatus 300 according to an alternative embodiment of the present invention. The apparatus 300 generally includes a Z stage plate 322, a stage mirror 310 and a substrate chuck 306. The Z-stage plate 322 may be attached to an XY stage 308 that can scan the Z stage plate 322, stage mirror 310 and substrate chuck 306 in an X-Y plane. The chuck 306, stage mirror 310, Z-stage plate 322 and XY stage 308 may be located in a vacuum chamber 303 so that the apparatus 300 can be used, e.g., in conjunction with an electron beam or ion beam system. In an alternative embodiment depicted in FIG. 3B, the stage mirror 310 may be built into the substrate chuck 306.

An energetic beam column 302 produces an energetic beam 301 directed at a substrate 304 on the substrate chuck 306. An XY beam deflection mechanism 307 steers the energetic beam 301 in the XY plane (i.e., the plane of the substrate 304). By way of example, the energetic beam column 302 may be an electron beam column, in which case the energetic beam 301 is a beam of electrons. Alternatively, the energetic beam column 302 may be an ion optical column or an optical column producing some form of energetic electromagnetic radiation, e.g., infrared, visible or ultraviolet light. In the case of an electron or ion optical column, the XY beam deflection mechanism 307 may include electrostatic deflector plates or electromagnets or some combination of both. In the case of an infrared, visible or ultraviolet optical column (e.g., based on a laser as a source of electromagnetic radiation) the XY beam deflection mechanism 307 may include a beam steering mirror.

One or more sensors 336, e.g., capacitance sensors, may be placed proximate the substrate chuck 306 to measure relative motion between the chuck 306 and the stage mirror 310. The sensors 336 and/or an interferometer photo detector 319 may be coupled to actuators 346 on the XY stage in an outer feedback loop 350 as described above. Similarly, the photo detector 319 and/or sensors 336 may be coupled to a beam deflection mechanism 307 by an inner feedback loop 352 as described above.

The chuck 306 may be a bi-polar or mono-polar electrostatic chuck. The stage mirror 310 may be made of an electrically insulating material such as alumina. Alternatively, electrically conductive or semi-conductive materials such as silicon carbide may be used. The stage mirror 310 includes highly polished faces 314 oriented perpendicular to the X and/or Y axes. The highly polished faces 314 serve as reflecting surfaces for an interferometer 312 having a beamsplitter 318, a fixed mirror 320 and a photodetector 319. The beamsplitter 318 splits a beam of light 316 (e.g., from a laser). Part of the light 316 reflects off the fixed mirror 320 back to the beamsplitter 318. Another part of the light reflects off the highly polished face 114 back to the beamsplitter 118. The beamsplitter 118 combines both parts and the combined optical signal strikes a photodetector 119. An interference signal from the photodetector 119 changes in a predictable way as a result of movement of the stage mirror 110.

Figure 3B:
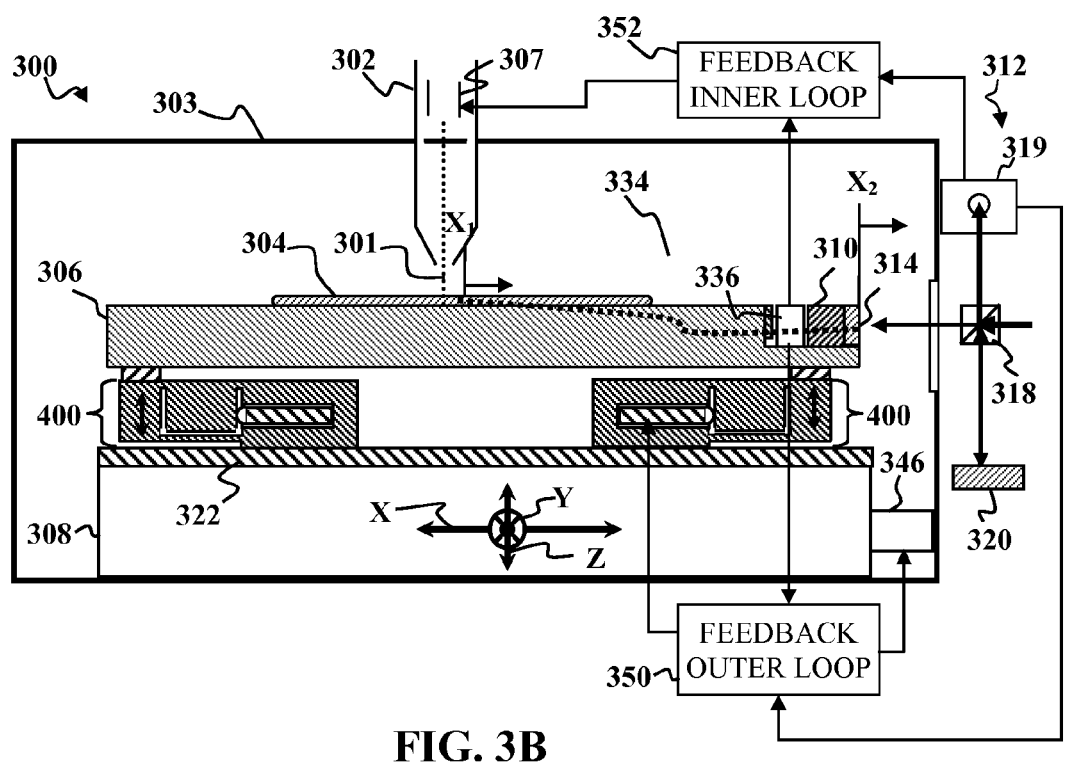

The substrate chuck 306 may be mounted to the stage mirror 310 with constraints on six degrees of freedom of movement of the chuck 306 relative to the stage mirror 310. By way of example, the chuck 306 may be kinematically mounted to the stage mirror 306 through a sphere and cone mount, a sphere and groove mount and a sphere and flat mount. Kinematic mounting generally refers to a mount that places independent (i.e., non-redundant) constraints on the six degrees of freedom (translation along the X, Y and Z directions and rotation about the X, Y and Z axes). In an example of kinematic mounting the stage mirror 310 may be mounted to the Z stage plate 322 with sphere and V-groove type mount, a cone and sphere type mount and a sphere and flat type mount. The constraints on the chuck 306 need not be strictly kinematic. For example, the chuck 306 may be mounted by three sphere and groove mounts with the grooves being aligned at 120° angles relative to each other. The spheres can be the supports, and the V-grooves can be formed in the back of the chuck 306. A scheme with three V-grooves supporting the chuck with three spheres is fully kinematic, as is the scheme with a cone (or trihedral hollow), a vee, and a flat, supporting a chuck with three spheres. These two schemes are equivalent, but differ in the balance of forces and dynamics. The three V-groove scheme has better balance due to symmetry. Alternatively, the chuck 306 may be rigidly attached to the stage mirror 310, e.g., with bolts or screws or the chuck 306 may be built into the stage mirror 310 or the stage mirror 310 may be built into the chuck 306, e.g., as illustrated in FIG. 3B. Preferably, the flexures 400 are characterized by high stiffness with respect to motion in the X-Y plane and rotation about Z-axis constraints while allowing the stage mirror 310 to move along the Z-axis.

One or more force flexures 400 couple the stage mirror 310 to the Z stage plate 322. The force flexures 400 include actuators configured to impart movement to stage mirror 310 and substrate chuck 306 in a Z direction as the Z stage plate 322 is scanned in the X-Y plane perpendicular to the Z direction. With two or more force flexures 400, independent adjustment of the Z-deflection of each force flexure 400 provides tilt control of the stage mirror 310 and the substrate chuck 306.

As shown in FIGS. 4A-4B each force flexure 400 includes a base portion 402 and a cantilever portion 404. The base portion 402 is secured to the Z stage plate 322 by suitable means such as bolts or screws. The cantilever portion 404 extends in a lateral direction (e.g., the X or Y direction) from the base portion 402. The cantilever portion 404 includes a parallelogram flexure 403 coupled between the base portion 402 and a free end 406 of the cantilever portion 404. The base portion 402 and cantilever portion 404 (including the parallelogram flexure 403) may be integrally formed from a single block of material. The material is preferably one that provides high strength, high electrical resistivity, and a relatively high stiffness to mass ratio. It is also desirable for the material to have a high ration of yield strength to Young's modulus. Titanium is an example of a suitable material.

The parallelogram flexure 403 includes an upper arm 408 and a lower arm 410. The upper and lower arms 408, 410 are substantially parallel to each other. The upper arm is spaced apart from the lower arm 410 along the Z direction by a distance c. A lever block 412 depends from the upper arm 408. A channel 414 separates the lever block is separated from the base portion 402, free end 406 and lower arm 410. A first resilient hinge 416 connects the upper arm 408 to the base portion 402. A second resilient hinge 418 connects the upper arm 408 to the free end 406. A third resilient hinge 420 connects the lower arm 410 to the base portion 402. A fourth resilient hinge 422 connects the lower arm 410 to the free end 406. The first and second hinges 416, 418 are separated by a lateral distance a. Similarly, the third and fourth hinges 420, 422 are separated b from each other by an approximately equal lateral distance a. The hinges 416, 418, 420, 422 may be formed by suitably thing the material at the junctures between the upper and lower arms 408, 410 and the base portion 402 and/or free end 406. An isolator 405 made of an electrically insulating material may connect the free end 406 to the stage mirror 310.

As a result of the configuration of the arms and hinges of the cantilever portion 404 a laterally directed force F acting on the lever block 412 causes the free end 406 to move in the Z-direction. Such a lateral force F may be provided in a controllable fashion by a piezoelectric actuator 424, which may be located in a bore 426 in the base portion 402 and secured in place with a threaded plug 428. The piezoelectric actuator 424 can expand laterally against the lever block 412. The piezoelectric actuator 424 may include a joint end with a curved (e.g., spherical) surface 430 that abuts the lever block 412. The end surface 430 makes contact with the lever block 412 at a point located a distance b from the upper arm 408. The curved surface 430 of the joint end is desirable to keep the piezoelectric actuator from bending. The ratio b/a determines the leverage and stiffness of the parallelogram flexure 403.

The parallelogram flexure 403 and lever block 412 allows the lateral force F to be converted into vertical motion of the free end 406 of the cantilever 404. Thus a relatively long piezoelectric actuator 424 may be used in a force flexure 400 of limited height. This combination makes the force flexures relatively stiff and strong. A typical piezoelectric stack may produce about 1 micron of lateral expansion for each millimeter of stack length. Thus a 100 millimeter piezoelectric actuator 424 may expand by about 100 microns. By a suitable choice of b and a the force flexure 400 can transfer 100 microns of piezoelectric actuator expansion into about 300 microns of movement of the free end 406. The design of the force flexure 400 provides for a high lateral stiffness, which creates a good coupling of the stage mirror 310 to the XY stage 308. The Z stiffness of the force flexure 400 also allows for a high bandwidth of control of motion in the Z-direction.

Other types of piezo-based actuators are suitable as alternatives to the piezoelectric actuator 424 provided they meet the dynamic and magnetic requirements. For example, voice coil type actuators may be used instead of piezoelectric actuators. In electron beam applications voice coil type actuators may need to be magnetically shielded to avoid disturbing the electron beam.

A substrate support apparatus of the type shown in FIG. 3A using force flexures of the type shown in FIGS. 4A-4B provides considerably improved performance compared to a prior art type substrate support of the type depicted in FIG. 1. Untracked errors in a prior art system of the type shown in FIG. 1 have been measured to be on the order of about 100 nm. In a substrate support of the type shown in FIG. 3A, by contrast, tracking errors resulting from small dynamic parasitic motions of the wafer chuck 306 relative to the stage mirror 310 have been measured to be on the order of 0.1 nm standard deviation, an improvement of about three orders of magnitude. Tests comparing scan-to-scan errors, intra-scan errors and kernel-to-kernel errors for the two types of substrate supports have also been performed. The results of these tests are summarized in TABLE I below.

TABLE I

|  | Spec (nm) | FIG. 1 Type Apparatus | FIG. 3A Type Apparatus |
| --- | --- | --- | --- |
| Scan-to-scan | 150 | 200-350 | 20-30 |
| Intra-scan | 150 | 20-60 | 3.2 |
| Kernel-to-kernel | 3 | 25-30 | 2 |

The scan to scan error includes wafer and chuck shifts due to end of swath turnaround deceleration and acceleration. It is the average untracked error between the wafer and the interferometer mirror.

The intra-scan error is measured as a shift between the chuck and the stage mirror while the stage is scanning at a constant velocity. The chuck is only subject to vibrations caused by stage bearings The image correction is based on small fragments of a swath called kernels. In this case the kernel contains 48 vertical scan lines, each line acquired every 12 microseconds. The line frequency is 83.3 kHz, and the kernel frequency is 1736 Hz. The image is realigned at the kernel frequency; therefore the kernel to kernel error is the residual error which the image computer's alignment system has to deal with.

Figure 5A:
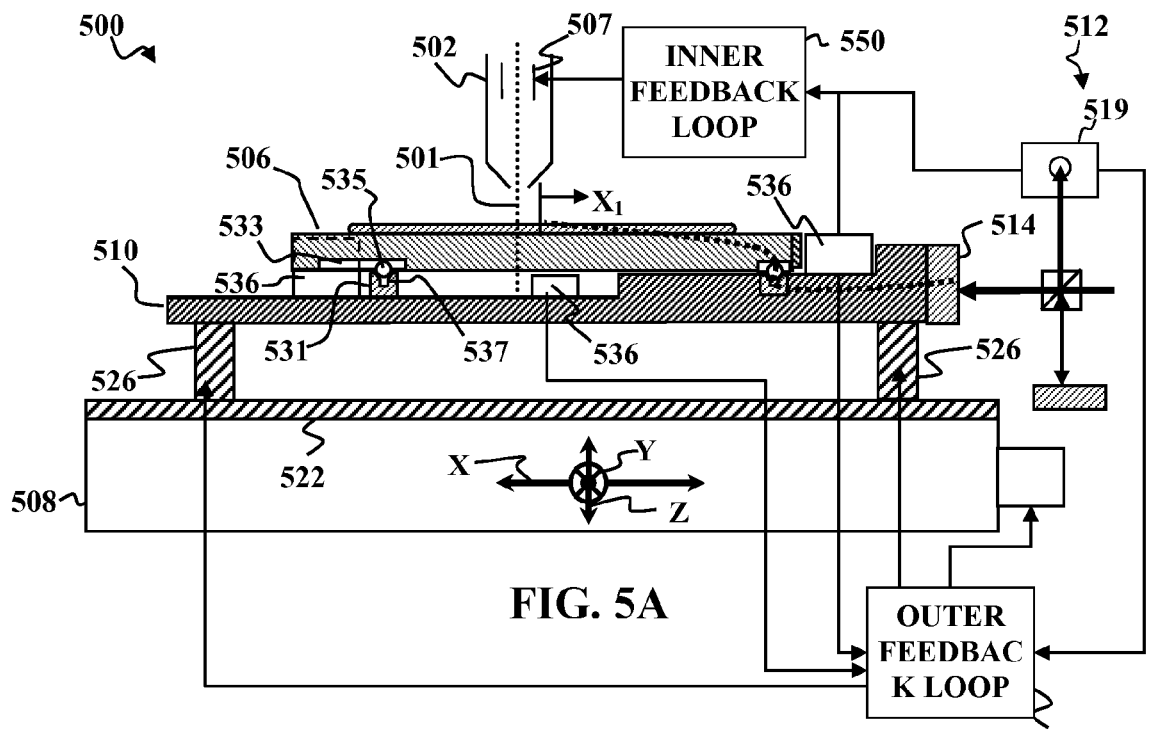
FIG. 5A is a cross-sectional schematic diagram of a substrate support system according to an alternative embodiment of the invention.
Figure 5B:
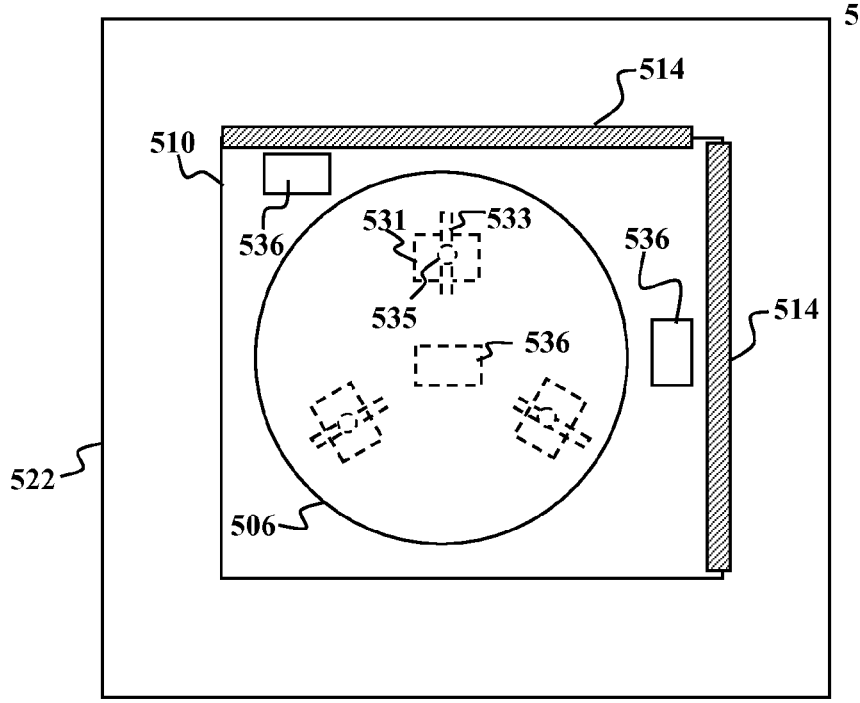
FIG. 5B is a plan view of the substrate support system of FIG. 5A.

It is noted that all the errors for the FIG. 1-*type* apparatus varied from test to test. Furthermore, the scan-to-scan error values for the FIGS. 3A-*type* apparatus appeared only when the apparatus was jolted by greater than about an acceleration of about 5 m/s$^2$ (about half the acceleration due to gravity). Embodiments of the present invention may include alternative actuators and flexures to those shown in FIG. 3A and FIGS. 4A-4B. For example, as shown in FIGS. 5A-5B, a substrate support apparatus 500 may have a stage mirror 510 coupled to a Z-stage plate 522 with vertical piezoelectric actuators 526. The stage mirror 510 may include highly polished surfaces 514, which may be used as reflecting surfaces for interferometers. A chuck 506 may be rigidly or kinematically mounted to the stage mirror 510 as described above. The Z-stage plate 522 may be attached to an XY stage 508. One or more actuators 526 may be coupled directly between the Z-stage plate 522 and the stage mirror 510. By way of example, the actuators 526 may be piezoelectric actuators that expand in the Z-direction. One or more constraints 525 may be coupled between the Z-stage plate 522 and the chuck and/or stage mirror 510. The constraint 531 is configured to restrict movement of the stage mirror 510 and/or chuck 506 in one or more directions perpendicular to the Z-direction. By way of example, the constraints 531 may each include a V-groove 533 parallel to the Z-direction. A spherical bearing 535 is disposed between the V-groove 533 and a recess 537 in the stage mirror 510.

An energetic beam column 502 produces an energetic beam 501 directed at a substrate 504 on the substrate chuck 506. An XY beam deflection mechanism 507 steers the energetic beam 501 in the XY plane (i.e., the plane of the substrate 504). By way of example, the energetic beam column 502 may be an electron beam column an ion optical column or an optical column producing some form of energetic electromagnetic radiation, e.g., infrared, visible or ultraviolet light.

One or more sensors 536, e.g., capacitance sensors, may be placed proximate the substrate chuck 506 to measure relative motion between the chuck 506 and the stage mirror 510. The sensors 536 and/or a photo detector 519 of an interferometer 512 may be coupled to actuators 546 on the XY stage in an outer feedback loop 550 as described above. Similarly, the photo detector 519 and/or sensors 536 may be coupled to a beam deflection mechanism 507 of the energetic beam column 502 by an inner feedback loop 352 as described above.

As can be seen from Table I above, embodiments of the present invention provide reduced scan-to-scan, intra-scan and kernel-to-kernel errors compared to prior art substrate support apparatus. Embodiments of the present invention are particularly well-suited to applications that are sensitive to motion of the substrate in a direction perpendicular to a plane of the substrate. Examples of such applications include, but are not limited to wafer inspection, reticle inspection, lithography or reticle printing. Embodiments are also particularly well-suited for use in vacuum including electron microscopy, ion beam machining, electron beam machining and the like.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A substrate support apparatus, comprising:
    a Z stage plate;
    a stage mirror;
    one or more actuators attached to the Z stage plate, wherein the one or more actuators are configured to impart movement to the stage mirror in a Z direction as the Z stage plate is moved in one or more directions in a plane perpendicular to the Z direction, wherein the Z direction is a vertical direction that is normal to an X direction and a Y direction; and
    a substrate chuck mounted to the stage mirror with constraints on six degrees of freedom of movement of the substrate chuck;
    wherein the one or more actuators include one or more force flexures
    wherein each force flexure includes:
        a base portion attached to the Z stage plate; and
        a cantilever portion extending in a lateral direction from the base portion, wherein the cantilever portion includes a parallelogram flexure coupled between the base portion and a free end of the cantilever portion.

2. The apparatus of claim 1 wherein the base portion and cantilever portion are integrally formed from a single block of material.

3. The apparatus of claim 1 wherein the base portion and cantilever portion are made of titanium.

4. The apparatus of claim 1 wherein the parallelogram flexure includes an upper arm spaced along the Z direction from a lower arm, wherein the upper arm is connected to the base portion by a first resilient hinge and connected to the free end by a second resilient hinge, wherein the lower arm is connected to the base portion by a third resilient hinge and connected to the free end by a fourth resilient hinge.

5. The apparatus of claim 4, wherein the parallelogram flexure further comprises a lever block located between the upper and lower arms, wherein the lever block is attached to the upper arm between the first and second hinges.

6. The apparatus of claim 5, further comprising an actuator operably coupled between the base portion and the lever block such that exertion of a force by the actuator against the lever block in the lateral direction causes the free end to move in the Z direction.

7. The apparatus of claim 6 wherein the actuator is a piezo electric actuator.

8. The apparatus of claim 7 wherein the piezoelectric actuator includes a joint with a curved surface, the joint being located at an end of the piezoelectric actuator such that the curved surface abuts the lever block.

* * * * *